United States Patent
Lee

(10) Patent No.: US 7,071,999 B2
(45) Date of Patent: Jul. 4, 2006

(54) METHOD FOR CONTROLLING MEMORY IN DIGITAL SYSTEM

(75) Inventor: Kyung Mee Lee, Seoul (KR)

(73) Assignee: LG Electronics Inc., Seoul (KR)

(*) Notice: Subject to any disclaimer, the term of this patent is extended or adjusted under 35 U.S.C. 154(b) by 389 days.

(21) Appl. No.: 10/084,372

(22) Filed: Feb. 28, 2002

(65) Prior Publication Data

US 2002/0118306 A1    Aug. 29, 2002

(30) Foreign Application Priority Data

Feb. 28, 2001    (KR) ............................. 2001-10321

(51) Int. Cl.
| | |
|---|---|
| H04N 7/12 | (2006.01) |
| H04N 7/16 | (2006.01) |
| H04N 7/26 | (2006.01) |
| H04N 7/173 | (2006.01) |
| H04N 9/64 | (2006.01) |
| G06F 12/00 | (2006.01) |
| G06F 12/02 | (2006.01) |
| G06F 13/00 | (2006.01) |
| G06F 13/18 | (2006.01) |
| G06T 9/00 | (2006.01) |
| G06K 9/36 | (2006.01) |
| G06K 9/46 | (2006.01) |

(52) U.S. Cl. ................. 348/714; 348/716; 348/231.1; 345/535; 345/543; 345/544; 345/555; 386/112; 375/240.01; 382/235; 725/134; 725/142; 711/101; 711/151; 711/173

(58) Field of Classification Search ................ 348/714, 348/716–719, 231.1, 553; 345/530, 535, 345/541–547, 555; 386/53, 111–112; 375/240.01, 375/240.24, 240.26; 382/232, 235; 725/134, 725/142; 711/101, 151, 153, 165, 173
See application file for complete search history.

(56) References Cited

U.S. PATENT DOCUMENTS

| | | | |
|---|---|---|---|
| 6,038,033 A * | 3/2000 | Bender et al. | 358/1.16 |
| 6,208,273 B1 * | 3/2001 | Dye et al. | 341/51 |
| 6,266,104 B1 * | 7/2001 | Kim | 348/714 |
| 6,765,625 B1 * | 7/2004 | Lee et al. | 348/714 |
| 6,775,751 B1 * | 8/2004 | Tremaine | 711/154 |
| 6,870,577 B1 * | 3/2005 | Crocitti et al. | 348/718 |
| 6,879,266 B1 * | 4/2005 | Dye et al. | 341/51 |
| 2001/0038642 A1 * | 11/2001 | Alvarez et al. | 370/477 |
| 2001/0054131 A1 * | 12/2001 | Alvarez et al. | 711/105 |

* cited by examiner

Primary Examiner—Brian P. Yenke
(74) Attorney, Agent, or Firm—Birch, Stewart, Kolasch & Birch, LLP

(57) ABSTRACT

Method for controlling a memory in a digital system, including the steps of (a) dividing the memory into a plurality of fixed sized memory blocks, (b) defining at least one of the memory blocks as a compression/decompression region, (c) assigning compression priorities to rest of the memory blocks except the memory blocks defined as the compression/decompression region, and (d) making the memory blocks to deal with an external data received according to an external command, and carrying out compression/decompression of data required in the dealing with the external data at the compression/decompression region according to the compression priorities.

14 Claims, 6 Drawing Sheets

METHOD FOR CONTROLLING MEMORY IN DIGITAL SYSTEM

This application claims the benefit of the Korean Application No. P2001-10321 filed on Feb. 28, 2001, which is hereby incorporated by reference.

BACKGROUND OF THE INVENTION

1. Field of the Invention

The present invention relates to a method for controlling a memory in a digital system.

2. Background of the Related Art

In embedded systems developed recently there are ones that require processing and managing of a large amount of data. For an example, the digital system, such as a digital TV receiver, employs a web data used in a computer environment, or a data received from, and required for broadcasting, or an additional data. Recently, a broadcasting for transmission of data is under preparation.

A current data base system developed and used for more convenient and effective processing of a large amount of data uses disks for recording data, and uses techniques of transaction management, query handling, synchronism control, indexing, hashing, and the like.

Moreover, though a main memory resident type data base system that is made possible by development of a memory size also has a main data base on the memory, in most of the cases, the main memory resident type data base system is based on disks which can back up the main data base. The system having such a disk makes no assumption of a limitation of a maximum storage capacity of data.

However, the case is limited, in which the disk is based in the embedded system actually, and, though memory technologies are developing currently, a system only having the memory is required to assume very limited use of the memory in comparison to a disk, to require a system that manage data in the system only having a limited memory.

Moreover, though it does not matter for a system having an amount of data fixed in advance required to be stored in the system, there can be a storage demand greater than a memory size capable to store in a system the data is added, erased, and queried because a maximum required storage capacity is not fixed.

SUMMARY OF THE INVENTION

Accordingly, the present invention is directed to a method for controlling a memory in a digital system that substantially obviates one or more of the problems due to limitations and disadvantages of the related art.

An object of the present invention is to provide a method for controlling a memory in a digital system having a limited size of memory, which can minimized a system performance deterioration, and facilitates storage of data greater than the limited capacity of the memory.

Another object of the present invention is to provide a method for controlling a memory in a digital system, which has advantages of the present data base system, such as avoidance of duplication of data, and an easy access to a data, and the like.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for controlling a memory in a digital system includes the steps of (a) dividing the memory into a plurality of fixed sized memory blocks, (b) defining at least one of the memory blocks as a region for compression/decompression, (c) assigning compression priorities to rest of the memory blocks except the memory blocks defined as region for compression/decompression, and (d) making the memory blocks to deal with an external data received according to an external command, and carrying out compression/decompression of data required in the dealing with the external data according to the compression priorities.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
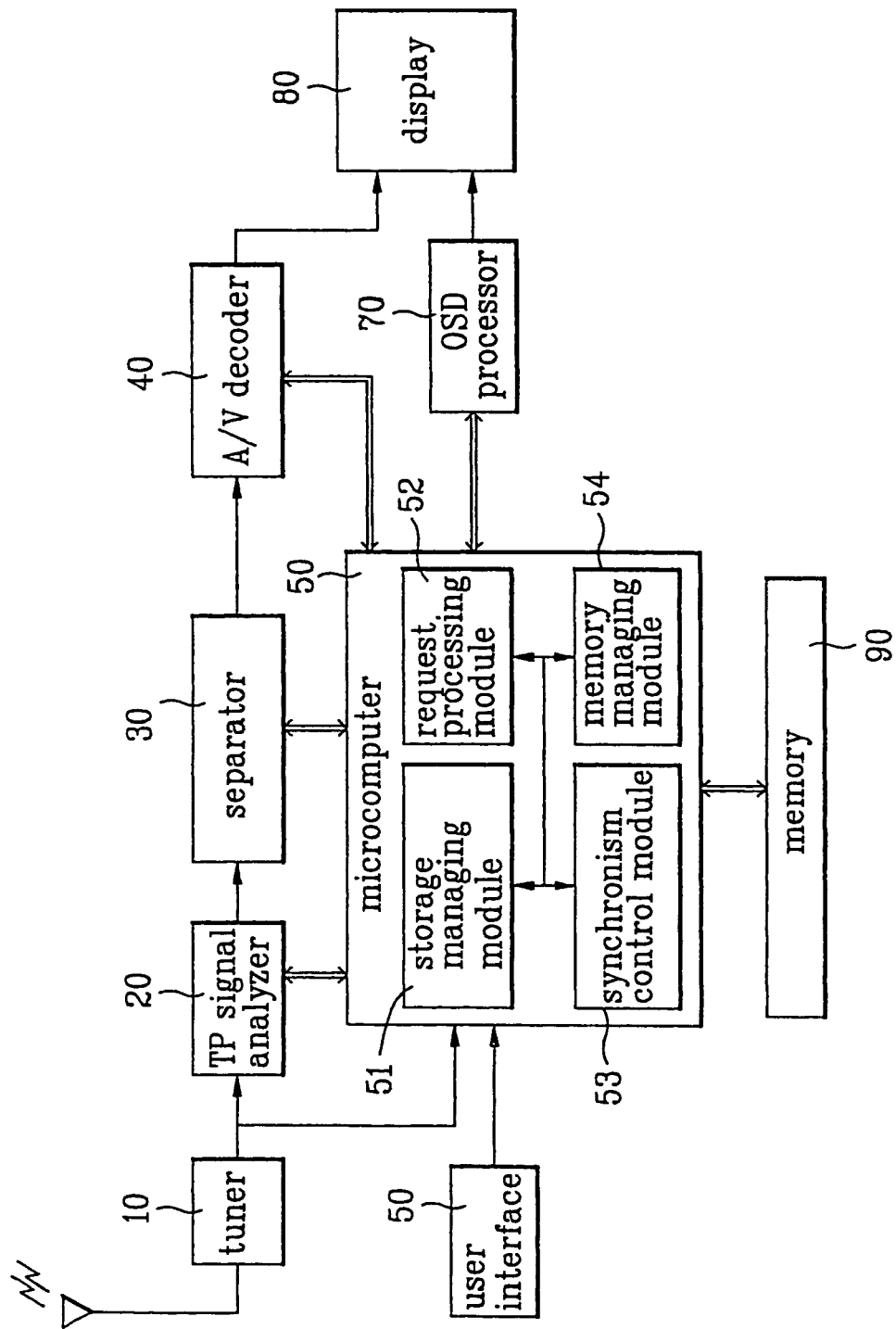
FIG. 1 illustrates a block diagram showing a system of a digital TV receiver in accordance with a preferred embodiment of the present invention.

Reference will now be made in detail to the preferred embodiments of the present invention, examples of which are illustrated in the accompanying drawings. In this embodiment, a digital TV receiver is taken into account among the digital systems. FIG. 1 illustrates a block diagram showing a system of a digital TV receiver in accordance with a preferred embodiment of the present invention.

Referring to FIG. 1, the digital TV receiver includes a tuner 10 for receiving a digital broadcasting signal, a TP (transport) signal analyzer 20 for analyzing a TP signal from the digital broadcasting signal, to detect an audio signal and a video signal, a separator 30 for separating, and respectively decoding the audio signal and the video signal detected at the TP signal analyzer 20, a decoder 40 for decoding the audio signal and the video signal decoded at the separator 30, and a microcomputer 50 for controlling parts of the TV receivers.

The microcomputer 50 divides channel data, program data, and information data received through the tuner 10 into fixed size blocks, stores in the memory 90, and manages the stored data blocks.

The digital TV receiver also includes an OSD (On Screen Display) processor 70 for providing an OSD text, and a display 80 for selectively superimposing the audio signal and the video signal decoded at the decoder 40 with the OSD text from the OSD processor 70, and displaying on a screen.

The microcomputer 50 in the digital TV receiver includes a storage managing module 51 for storing all the data from the tuner 10 in forms of data blocks by indexing or hashing, and carrying out a function to find a desired block from the stored data blocks quickly, a request processing module 52 for facilitating storage of a desired data in the memory 90, or erasing or finding the desired data from the memory, a synchronism control module 53 for processing various requests on the same time, and a memory managing module 54 for managing the memory 90 with the memory 90 divided into same sized blocks.

Figure 2:
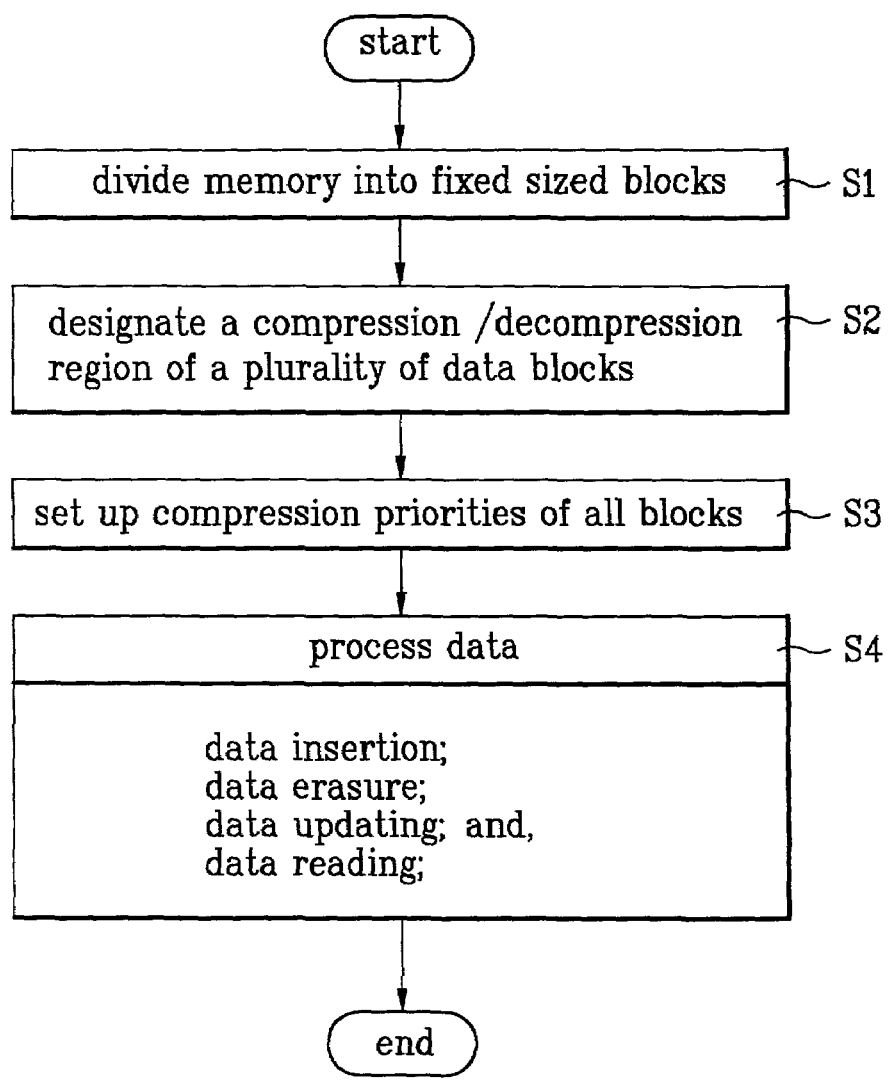
FIG. 2 illustrates a flow chart showing the steps of a process for controlling a memory in a digital system in accordance with a preferred embodiment of the present invention.

The operation of the digital TV receiver of the present invention will be explained with reference to the attached drawings in detail. FIG. 2 illustrates a flow chart showing the steps of a process for controlling a memory in a digital TV receiver in accordance with a preferred embodiment of the present invention.

Referring to FIG. 2, the memory managing module 54 in the microcomputer 50 divides the memory 90, to be used as a storage space, into fixed size blocks. Then, memory managing module 54 combines at least one of the memory blocks and designates as a compression/decompression region for temporary storage of a compressed data, or compressing a data.

The memory managing module 54 records a number of access times to the data in each memory block, and measures an access frequency of the memory block based on the number of access times. The memory managing module 54 sets up priorities of compression of the memory blocks based on the access frequency for compressing data when a capacity of the memory 90 lacks. The lower the frequency of access, the higher the compression priority. Then, the microcomputer processes the received data.

Figure 3:
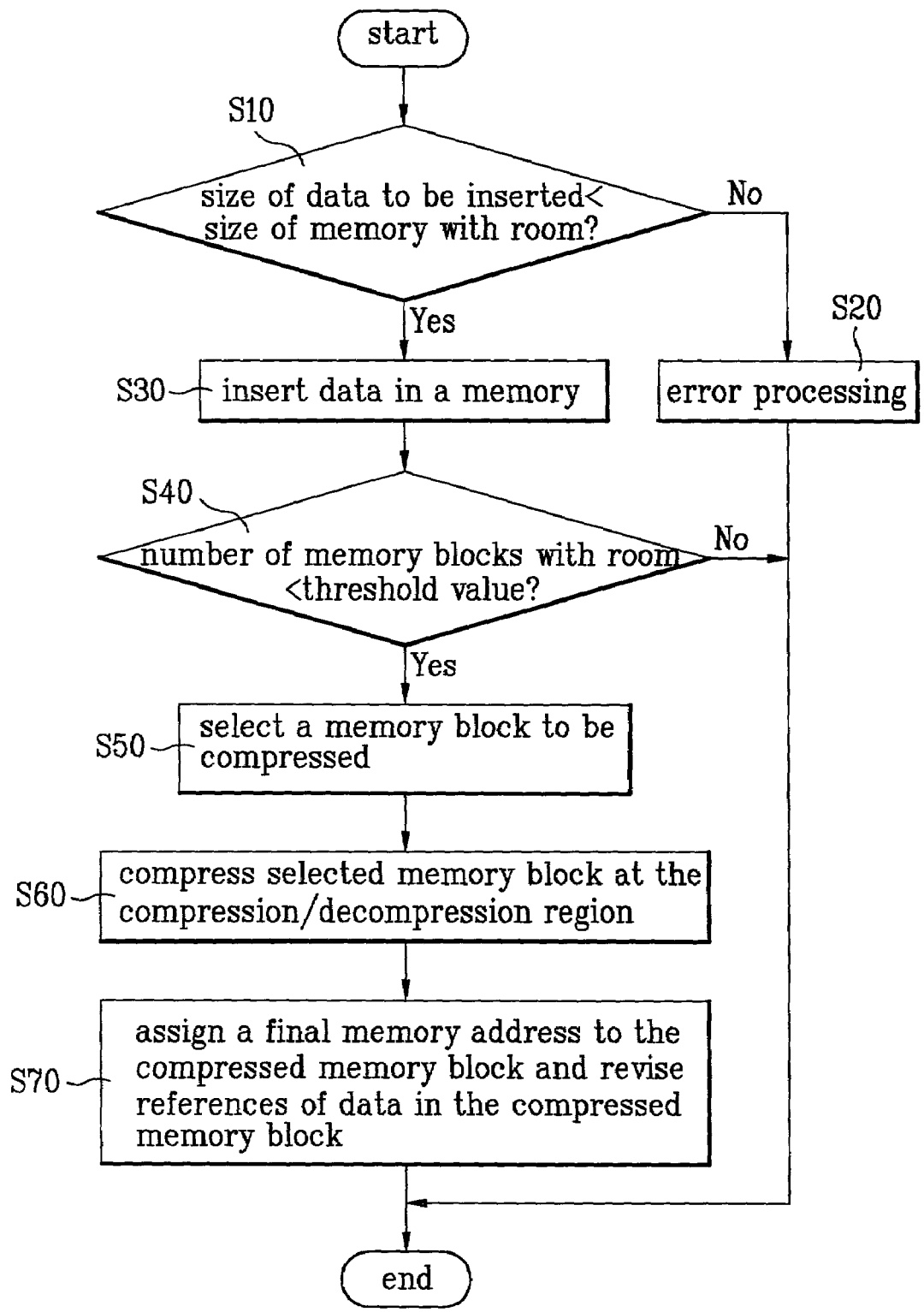
FIG. 3 illustrates a flow chart showing the steps of a process for inserting a data in a memory in a digital system in accordance with a preferred embodiment of the present invention.

The data processing includes data insertion, data erasure, data up-dating, and data read. The steps of the data processing will be explained with reference to the attached drawings. FIG. 3 illustrates a flow chart showing the steps of a process for inserting a data in a memory in a digital system in accordance with a preferred embodiment of the present invention.

Referring to FIG. 3, as explained, after the microcomputer 50 divides the memory 90 into a plurality of fixed size memory blocks according to the process shown in FIG. 2, the microcomputer 50 designates at least one of the memory blocks as the compression/decompression region.

Then, the microcomputer 50 assigns the priorities of compression to rest of fixed size memory blocks except the compression/decompression region. It is determined if the memory 90 has an empty memory space for the data to be inserted.

As a result of the comparison, it is known that there is no space in the memory 90 for receiving a data to be inserted therein even after all the memory blocks are compressed, the microcomputer 50 proceeds to an error processing state. Opposite to this, if there is an empty memory block or blocks as large as the data to be inserted, the data is inserted in the empty memory block or blocks of the memory 90.

Then, upon completion of insertion of the data, the microcomputer 50 compares a number of the empty memory blocks remained presently to a preset threshold value (a number of minimum memory blocks required). As a result of the comparison, if the preset threshold value is smaller than the number of empty memory blocks, the process for inserting a data is finished.

Opposite to this, if the preset threshold value is greater than the number of empty memory blocks, the microcomputer 50 selects a memory block to be compressed presently from remained memory blocks according o the priorities of compression.

The step for selecting the memory block to be compressed is started with reference to the compression priorities from a moment when use of a last memory block available for the data insertion is started, or the preset threshold value is exceeded.

Then, the microcomputer 50 transfers the data in the memory block selected for the compression to the compression/decompression region, and compresses the data. The data in the selected memory block under compression can be accessed normally The data in the compressed memory block is stored at other designated location of the memory 90 provided for the compressed memory block, and the compressed memory block is defined as an empty memory block by the microcomputer 50.

References representing the data in the compressed memory block are changed to a first starting address of the compressed memory block. Accordingly, when it is intended to make an indirect access to the data in the compressed memory block, the microcomputer 50 is required to determine the memory block under access presently is a compressed memory block.

If it is determined that the memory block under access presently is a compressed memory block, the microcomputer 50 decompresses the compressed memory block in the compression/decompression region, and reads the decompressed memory block.

Figure 4:
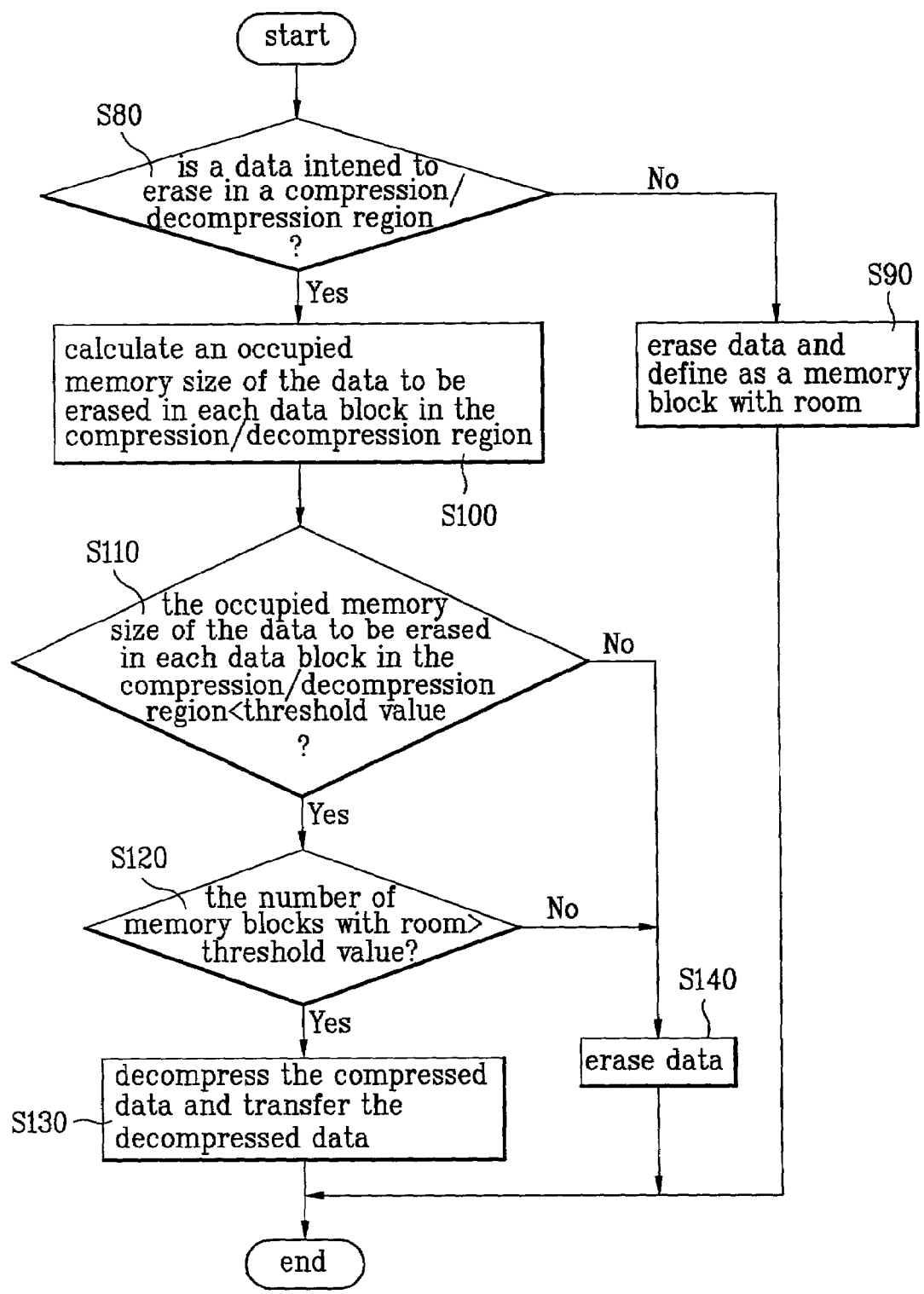
FIG. 4 illustrates a flow chart showing the steps of a process for erasing a data from a memory in a digital system in accordance with a preferred embodiment of the present invention.

FIG. 4 illustrates a flow chart showing the steps of a process for erasing a data from a memory in a digital TV receiver in accordance with a preferred embodiment of the present invention.

Referring to FIG. 4, the microcomputer 50 divides the memory 90 into fixed sized memory blocks according to the process in FIG. 2. The microcomputer 50 defines at least one of the memory blocks as a compression/decompression region. Then, the microcomputer 50 assigns to a memory block each having a compression priority set up according to a frequency of access.

The microcomputer 50 determines the data intended to erase is a data stored in the compression/decompression region. As a result of the determination, if it is determined that the data intended to erase is a data, not in the compression/decompression region, but in the memory blocks, the data is erased.

Opposite to this, as a result of the determination, if it is determined that the data intended to erase is a data in the compression/decompression region, the microcomputer 50 calculates a size of memory occupied by the data to be erased in respective data blocks in the compression/decompression region.

That is, if the occupied memory size is large, the microcomputer 50 determines that the memory in the block having the data erased therefrom has most of the memory left as a room space, and if the occupied memory size is small, the microcomputer 50 determines that the memory in the block having the data erased therefrom has many other data still stored in the memory block even if the data to be erased is erased.

Therefore, the microcomputer 50 compares the occupied memory size in the memory block in the compression/decompression region and the threshold occupied memory size.

As a result of the comparison, the occupied memory size calculated for each of the memory blocks is smaller than the threshold occupied memory size, the microcomputer 50 erases the compressed data and finishes the erasing process. Opposite to this, if the occupied memory size for each of the memory blocks is larger than the threshold occupied memory size, the microcomputer 50 decompresses the data.

In this instance, referring to FIG. 4, before decompression of the compressed memory, i.e., compressed memory block, the microcomputer 50 compares a number of empty memory blocks in the memory 90 to the threshold value of empty memory blocks. Only when the number of empty memory blocks are greater than the threshold value of empty memory blocks, i.e., only when room of the memory is adequate, the microcomputer 50 decompresses the compressed data. In this instance, as explained, the data in the memory block can be accessed normally until the erasing process is finished completely.

When the memory block is decompressed, other memory block can also be decompressed by the microcomputer 50.

Figure 5:
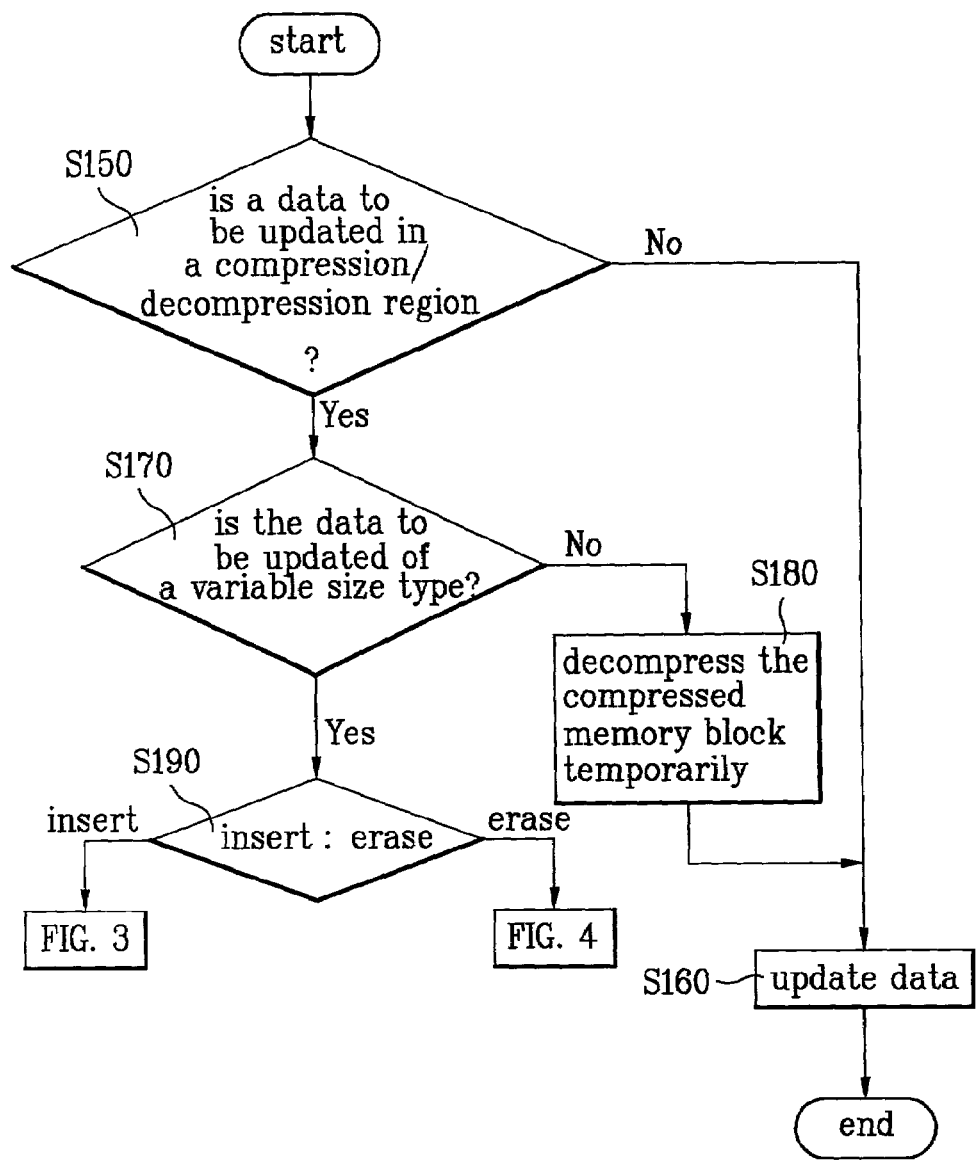
FIG. 5 illustrates a flow chart showing the steps of a process for up-dating a data stored in a memory in a digital system in accordance with a preferred embodiment of the present invention; and, FIG. 6 illustrates a flow chart showing the steps of a process for reading a data stored in a memory in a digital system in accordance with a preferred embodiment of the present invention.

FIG. 5 illustrates a flow chart showing the steps of a process for up-dating a data stored in a memory in a digital TV receiver in accordance with a preferred embodiment of the present invention.

Referring to FIG. 5, the microcomputer 50 divides the memory 90 into fixed sized memory blocks according to the process in FIG. 2. The microcomputer 50 defines at least one of the memory blocks as a compression/decompression region. Then, the microcomputer 50 assigns memory blocks each having a compression priority set up according to a frequency of access.

The microcomputer 50 determines whether the data to be updated is stored in the compression/decompression region, or in the memory block. As a result of the determination, if it is determined that the data to be updated is stored in the memory blocks, the data is updated.

As a result of the determination, if it is determined that the data to be updated is stored in the compression/decompression region, the microcomputer 50 determines a type of the data to be updated is of a variable size type or not.

As a result of the determination, if the data to be updated is not the variable size type, the microcomputer 50 decompresses the compressed memory block temporarily, and updates the data to be updated. That is, when a fixed size data, with a fixed total size, is updated, the microcomputer 50 decompresses the compressed memory block, updates the data, and compresses the updated data.

On the other hand, as a result of the determination, if the data to be updated is the variable size type, the microcomputer 50 assigns a new memory block and updates the data to be updated. The microcomputer 50 erases the existing data. The updating process has the inserting process explained in FIG. 3 and the erasing process explained in FIG. 4.

Figure 6:
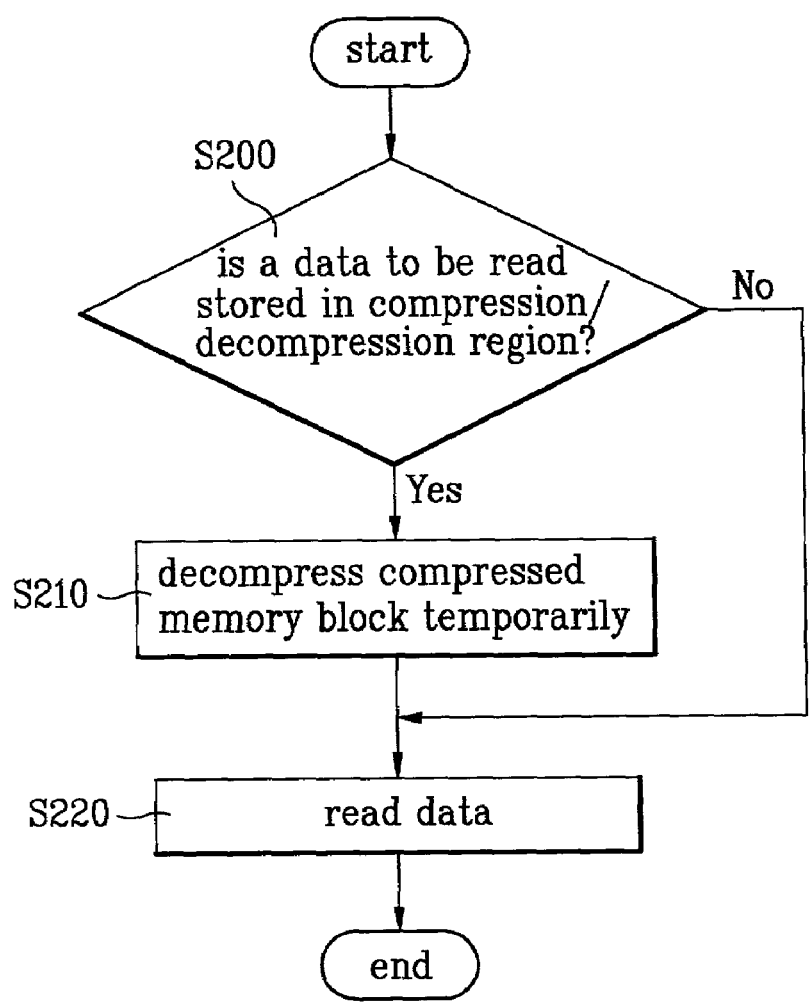

FIG. 6 illustrates a flow chart showing the steps of a process for reading a data stored in a memory in a digital TV receiver in accordance with a preferred embodiment of the present invention.

Referring to FIG. 6, the microcomputer 50 divides the memory 90 into fixed sized memory blocks according to the process in FIG. 2. The microcomputer 50 defines at least one of the memory blocks as a compression/decompression region. Then, the microcomputer 50 assigns to memory blocks each having a compression priority set up according to a frequency of access.

The microcomputer 50 determines whether the data to be read is stored in the compression/decompression region. As a result of the determination, if it is determined that the data to be read is stored in one of the memory blocks, the microcomputer 50 reads the data.

On the other hand, as a result of the determination, if the data to be read is stored in the compression/decompression region, the microcomputer decompresses the memory block having the data to be read stored therein temporarily and reads the data.

As explained, the microcomputer 50 is programmed such that an access to the memory block is possible when the memory block is compressed/decompressed during the time the microcomputer 50 processes the data in the memory block, such as insertion, erasure, updating, and reading.

In this instance, it is required that access to a data stored in a memory block is possible during the data is compressed/decompressed. Therefore, it is required that a final address of a compressed memory is fixed after compression of the memory block is finished completely, and the memory block under compression is valid until all the references indirectly indicating the data in the compressed memory block are revised.

Opposite to this, it is also required that a compressed memory block is valid until the compressed memory block is decompressed into a general memory block, and all the references indicating the data in the general memory block is restored into original values before compression.

As has been explained, the method for controlling a memory in a digital TV receiver of the present invention has the following advantages.

First, the division of a data into a plurality of storage units in managing the data, and the partial compression of the data permits reduce a system performance deterioration and storage of more data when it is required to store collected data in a limited memory size.

Second, the system does not come into an error state, but remains operative even if an allocated memory capacity lacks due to continuous addition of data and the like.

Third, the division of a memory into fixed sized memory blocks and compression of a part of the memory blocks permits to reduce an overall data processing time period required to process entire system.

It will be apparent to those skilled in the art that various modifications and variations can be made in the method for controlling a memory in a digital system of the present invention without departing from the spirit or scope of the invention. Thus, it is intended that the present invention cover the modifications and variations of this invention provided they come within the scope of the appended claims and their equivalents.

What is claimed is:

1. A method for controlling a memory in a digital system, comprising:
   (a) dividing the memory into a plurality of memory blocks, wherein each memory block has a same size as that of a neighboring memory block;
   (b) defining at least one of the memory blocks as a compression/decompression region;

(c) assigning compression priorities to the rest of the memory blocks except the at least one of the memory blocks defined as the compression/decompression region;

(d) making the memory blocks deal with an external data received according to an external command, and carrying out compression/decompression of data required in the dealing with the external data at the compression/decompression region according to the compression priorities; and (e) recording a number of access times data in each memory block is accessed, measuring access frequencies of the memory blocks based on the recorded number of access times, and resetting the assigned compression priorities.

2. The method as claimed in claim 1, wherein the compression priorities are set based on the access frequencies of the memory blocks.

3. The method as claimed in claim 1, wherein the dealing with data in the step (d) includes data insertion, data erasure, data updating, and data reading.

4. The method as claimed in claim 3, wherein the insertion includes:

(a) comparing a size of data to be inserted in the memory to empty memory blocks obtained by compression of the memory blocks, (b) inserting the data in the empty memory blocks when there are empty memory blocks as large as the data size to be inserted therein as a result of the comparison, and (c) upon completion of the data insertion, finishing the data insertion when a presently remaining number of empty memory blocks is greater than a preset threshold value, and selecting a memory block to be compressed from the remaining memory blocks according to the compression priorities when the presently remaining number of empty memory blocks greater than the preset threshold value.

5. The method as claimed in claim 4, wherein selecting a memory block to be compressed presently in the step (c) starts from a moment starting to use a last empty memory block for the data insertion, or from a moment the preset threshold value is exceeded, with reference to the compression priorities.

6. The method as claimed in claim 4, further comprising coming into an error processing state if there is no more space in the memory for accommodating the data to be inserted even after all of the memory blocks are compressed as a result of the comparison.

7. The method as claimed in claim 4, wherein the data erasure includes:

(a) determining the data to be erased of being a data stored in the compression/decompression region, (b) if it is determined that the data to be erased is a data stored, not in the compression/decompression region, but in the empty memory blocks as a result of the determination, erasing the data, (c) if it is determined that the data to be erased is a data stored in the compression/decompression region as a result of the determination, calculating a memory size occupied by the data to be erased in each data block in the compression/decompression region, (d) comparing an occupied memory size in each memory block in the compression/decompression region and a threshold value of the occupied memory size, and (e) erasing the compressed data and finishing the data erasure if the occupied memory size in each memory block calculated for each memory block is smaller than the threshold value of the occupied memory size as a result of the comparison, and decompressing the data if the occupied memory size in each memory block calculated for each memory block is greater than the threshold value of the occupied memory size.

8. The method as claimed in claim 7, further comprising:

comparing a number of empty memory blocks of the memory to the preset threshold value of a respective empty memory block before the compressed memory block is decompressed, and decompressing the compressed data only when the number of empty memory blocks of the memory is greater than the preset threshold value of the empty memory block.

9. The method as claimed in claim 7, wherein the data in a memory block is accessible normally until the erasing step is finished completely.

10. The method as claimed in claim 3, wherein the reading includes data reading a data in a decompressed memory block after decompressing a compressed memory block at the compression/decompression region, if the memory block being accessed presently is a compressed block.

11. The method as claimed in claim 3, wherein the data updating includes;

(a) determining the data to be updated of being a data stored in the compression/decompression region, or in a general memory block, (b) if it is determined that the data to be updated is a data stored in the memory block as a result of the determination, updating the data, (c) if it is determined that the data to be updated is a data stored in the compression/decompression region as a result of the determination, determining the data to be updated of being a variable size type, (d) if it is determined that the data to be updated is not a data of the variable size type as a result of the determination, decompressing the compressed data temporarily and updating the data to be updated, and (e) if it is determined that the data to be updated is a data of the variable size type as a result of the determination, assigning a new memory block, updating the data to be updated, and erasing an existing data.

12. The method as claimed in claim 11, wherein the data in a memory block selected during the data updating is accessible normally during the updating of data.

13. The method as claimed in claim 1, wherein the data in a memory block selected for compression is accessible normally during compression of data.

14. The method as claimed in claim 1, further comprising changing references indicating the data in the compressed memory blocks into first starting addresses of the compressed memory blocks, so that a presently accessing block is identified to be the compressed memory block when the data in the compressed memory block is indirectly accessed through the references.

* * * * *